(12) United States Patent
King

(10) Patent No.: US 7,266,010 B2
(45) Date of Patent: Sep. 4, 2007

(54) COMPACT STATIC MEMORY CELL WITH NON-VOLATILE STORAGE CAPABILITY

(75) Inventor: Tsu-Jae King, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 26 days.

(21) Appl. No.: 11/288,883

(22) Filed: Nov. 28, 2005

(65) Prior Publication Data
US 2007/0121371 A1    May 31, 2007

(51) Int. Cl.
*G11C 11/00* (2006.01)
(52) U.S. Cl. .................................. 365/154; 365/148
(58) Field of Classification Search ................ 365/154, 365/148, 185.07
See application file for complete search history.

(56) References Cited

U.S. PATENT DOCUMENTS

| | | | |
|---|---|---|---|
| 4,488,579 A | | 12/1984 | Lincke |
| 5,732,015 A | * | 3/1998 | Kazerounian et al. ...... 365/154 |
| 5,812,450 A | | 9/1998 | Sansbury et al. |
| 6,285,586 B1 | | 9/2001 | Lung et al. |
| 6,512,274 B1 | | 1/2003 | King et al. |
| 6,724,655 B2 | | 4/2004 | King |
| 7,132,350 B2 | * | 11/2006 | Yeh et al. .................... 438/467 |
| 2003/0179630 A1 | | 9/2003 | Choi |
| 2004/0141363 A1 | * | 7/2004 | Ohtsuka et al. ............. 365/154 |

* cited by examiner

*Primary Examiner*—Vu A. Le
(74) *Attorney, Agent, or Firm*—Bever, Hoffman & Harms, LLP; Jeanette S. Harms

(57) ABSTRACT

A static random access memory (SRAM) cell includes a SRAM circuit and a programmable resistor connected to a storage node of the SRAM circuit. The SRAM circuit can be any type of SRAM circuit, such as a 3T, negative differential resistance (NDR) transistor-based circuit, or a 6T (conventional SRAM) circuit. The programmable resistor can be formed in a metal layer above the SRAM circuit to minimize the area requirements for the memory cell. Just before shutdown of the SRAM cell, the resistance state of the programmable resistor is changed (if necessary) based on the data value stored at the storage node. The programmable resistor provides a non-volatile indication of the stored data value at the time of power off. Then, when power is restored to the SRAM cell, a data value based on the resistance state of the programmable resistor is written back into the SRAM circuit.

23 Claims, 4 Drawing Sheets

COMPACT STATIC MEMORY CELL WITH NON-VOLATILE STORAGE CAPABILITY

BACKGROUND OF THE INVENTION

1. Field of the Invention

The invention relates to the field of semiconductor memory, and in particular, to a structure and method for providing non-volatile data storage in high-speed memory.

2. Related Art

Random access memory (RAM) is memory used in electronic device applications that provides direct access to stored data. The two main types of RAM are dynamic random access memory (DRAM) and static random access memory (SRAM). A schematic circuit diagram of a DRAM cell 100A is depicted in FIG. 1A. DRAM cell 100A includes a storage capacitor 111 and an access transistor 112. Access transistor 112 is connected between a bit line 113 and storage capacitor 111, and the gate of access transistor 112 is connected to a word line 114. To write a data value into a storage node 115 at a junction between storage capacitor 111 and access transistor 112, bit line 113 is set to the appropriate data level, and word line 114 is set to a logic HIGH level. The data level on bit line 113 charges or discharges storage capacitor 111, and word line 114 is then set to a logic LOW level, thereby isolating and storing the desired value at storage node 115.

To read the stored value from storage node 115, word line 114 is set to a logic HIGH level, and a sense amplifier (not shown for clarity) is used to read out the stored value by sensing the voltage on bit line 113. The simplicity and layout efficiency of DRAM cell 100A beneficially enables the implementation of low cost, high density DRAM memory arrays. However, a read operation to DRAM cell 100A destroys the data value stored at storage node 115, thereby necessitating a refresh operation to ensure that the data survives the read operation. In fact, DRAM cell 100A requires frequent refreshing due to charge leakage from storage capacitor 111. The overall speed of a memory array that incorporates DRAM cell 100A is partially limited by this dynamic refreshing that is required to maintain the stored data (e.g., >10 ns cell access time).

Therefore, high performance electronic devices that require high speed memory typically use SRAM arrays. FIG. 1B shows a schematic circuit diagram of a conventional SRAM cell 100B. SRAM cell 100B includes p-channel transistors 121 and 122, and n-channel transistors 131, 132, 133, and 134. Transistors 121 and 131 are connected in series between an upper supply voltage $V_{DD}$ and a lower supply voltage $V_{SS}$ (the reference or "ground" potential), and transistors 122 and 132 are connected in series between upper supply voltage $V_{DD}$ and $V_{SS}$. The gates of transistors 121 and 131 are connected to the junction between transistors 122 and 132, and the gates of transistors 122 and 132 are connected to the junction between transistors 121 and 131. Transistors 121, 122, 131, and 132 therefore form a pair of cross-coupled inverters. Transistor 133 is connected between a bit line 141 and a storage node 161 at the junction between transistors 121 and 131, and transistor 134 is connected between a complementary bit line 142 and a complementary storage node 162 at the junction between transistors 122 and 132. The gates of transistors 133 and 134 are connected to a word line 150.

The cross-coupled inverters formed by transistors 121, 122, 131, and 132 act as a latch to store a data value at storage node 161 and a complement of the data value at storage node 162. To write a value into SRAM cell 100B, bit line 141 is set to the desired data level (i.e., voltage VBL) and bit line 142 is set to the complement of that data level (i.e., voltage/VBL). Word line 150 is then set to a logic HIGH level to turn on transistors 133 and 134 to allow the data on bit lines 141 and 142 to be latched into cross-coupled inverters formed by transistors 121, 122, 131, and 132. Word line 150 is then set back to a logic LOW level to turn off transistors 133 and 134, thereby isolating the latched data at storage nodes 161 and 162.

To perform a read operation, bit lines 141 and 142 are both driven to a logic HIGH level, after which word line 150 is set to a logic HIGH level to turn on transistors 133 and 134. Whichever of storage nodes 161 and 162 is storing a logic LOW value pulls down the associated one of bit lines 141 and 142, and this voltage change between bit lines 141 and 142 is detected by a differential sense amplifier (not shown) to determine the stored data value within SRAM cell 100B.

SRAM cell 100B is operationally faster (~1 ns access time) than DRAM cell 100A, due to the transistors 131 and 132 which actively pull down the voltage on their respective bit line 141 or 142 when the voltage at their respective storage node 161 or 162 is at a logic LOW value. However, the larger number of transistors used in SRAM cell 100B (six transistors versus only one transistor in DRAM cell 100A) means that SRAM cell 100B consumes significantly more chip area than DRAM cell 100A, thereby undesirably increasing the cost of memory arrays that incorporate SRAM cells 100B. Furthermore, a problem common to both DRAM cell 100A and SRAM cell 100B is that both types of memory cells lose stored data when power is removed from the cells (i.e. when the supply voltage $V_{DD}$ goes to zero volts).

Flash semiconductor memory arrays commonly use a single floating gate transistor for each memory cell, and therefore can achieve very small cell size. However, flash memories exhibit relatively long read and write times (e.g., >20 ns read time and >100 ns write time) and have limited cell endurance (e.g., $10^5$ read/write cycles). Therefore, flash memories are generally not suitable for high-speed, embedded RAM applications.

Some conventional efforts to add non-volatile properties to SRAM cells involve adding a floating gate transistor(s) to the SRAM cell. The floating gate transistor is used only for the storage of data during power down periods, thereby avoiding the speed and life cycle issues associated with flash memory implementations. Unfortunately, the floating gate transistor increases the size of the SRAM cell as well as the fabrication process complexity, and therefore undesirably increases layout inefficiency and cost.

Accordingly, it is desirable to provide a space-efficient SRAM memory cell/array with non-volatile storage capability.

SUMMARY OF THE INVENTION

Conventional SRAM cells provide high-speed data access, but are unable to retain stored data once power is removed. Adding floating gate transistors to such SRAM cells can provide non-volatile data storage behavior, but at the cost of increasing overall cell size and fabrication process complexity. However, by incorporating programmable resistors into layers above (or below) SRAM cells (e.g., metallization layers), non-volatile capabilities can be provided without increasing cell layout size.

In one embodiment, a non-volatile SRAM cell can include an SRAM data storage structure and a programmable resistor connected to a storage node of the SRAM data storage structure. The SRAM data storage structure can be any type of SRAM circuit. In one embodiment, the SRAM data storage structure can include two negative differential resistance (NDR) transistors connected in series between an upper supply voltage and a lower supply voltage. Read/write access to the data storage node at the junction of the two NDR transistors can be provided by a standard MOS transistor (which completes the "3T SRAM" circuit). In another embodiment, the SRAM data storage structure can be a standard 6T SRAM circuit.

The SRAM data storage structure provides the appropriate data storage functionality during normal operation of the non-volatile SRAM cell, whereas the non-volatile capabilities of the SRAM cell are provided by the programmable resistor. The programmable resistor can be programmed to high and low resistance states by applying appropriate voltage potentials across the terminals of the programmable resistor. Therefore, during a shutdown (power down) operation for the SRAM cell, the programmable resistor is set to a high or low resistance state, depending on the data value stored at the storage node of the SRAM data storage structure. The resistance value of the programmable resistor therefore provides a non-volatile record of the data stored in the SRAM data storage structure just before power was removed to the cell. Then, when power is re-applied to the memory cell, the resistance value of the programmable resistor determines the starting data value that is written back into the SRAM data storage structure.

In one embodiment, the terminal of the programmable resistor opposite to the storage node is coupled to receive a program voltage that varies according to the mode of operation for the SRAM cell. The programmable resistor can be configured such that when the storage node voltage is less than the program voltage, the programmable resistor is programmed into a low resistance state (if initially in a high resistance state), and when the storage node voltage is greater than the program voltage, the programmable resistor is programmed into a high resistance state (if initially in a low resistance state).

Thus, during normal operation of the SRAM cell, the programmable resistor can be initially set to a high resistance state, and the program voltage can be held at a logic LOW voltage, thereby ensuring that the programmable resistor remains in the high resistance state and therefore has minimal effect on the data stored at the storage node. However, during a shutdown procedure for the SRAM cell, the program voltage is raised to a logic HIGH voltage. If the storage node is also at the logic HIGH voltage (i.e., a logical 1), no voltage potential exists across the programmable resistor and no resistance change takes place. However, if the storage node is at the logic LOW voltage, the logic HIGH program voltage will cause the programmable resistor to be programmed to the low resistance state, thereby providing a non-volatile record of the SRAM data value even after power is removed from the cell.

During a subsequent startup procedure for the SRAM cell, a logic HIGH voltage is initially written to the storage node, and a logic LOW program voltage is supplied to the opposite terminal of the programmable resistor (i.e., the terminal not connected to the data storage node). If the programmable resistor is in a high resistance state, that high resistance state is maintained. In addition, because of the high resistance of the programmable resistor, minimal current flows through the programmable resistor, so that the logic HIGH voltage at the storage node is also maintained. However, if the programmable resistor is in a low resistance state, a large current can flow through the programmable resistor, and the logic HIGH voltage at the data storage node is quickly pulled down to the logic LOW voltage. At the same time, the logic HIGH data voltage and logic LOW program voltage cause the programmable resistor to be programmed to the high resistance state. In this manner, the startup procedure for the SRAM cell restores the pre-power down data value while also configuring the SRAM cell for normal operation (i.e., ensuring that the programmable resistor is in a high resistance state).

In one embodiment, the SRAM data storage structure can be "weakened" during this startup procedure to improve the voltage pulldown performance when restoring a logic LOW voltage to the SRAM data storage structure. For example, the NDR transistors in the 3T transistor circuit will generally require a high gate bias voltage (i.e., greater than the logic HIGH voltage plus the NDR transistor threshold voltage) to ensure proper latching operation. During the startup operation, this gate bias voltage can be reduced, thereby weakening the latching effect provided by the NDR transistors so that the logic HIGH voltage at the storage node is more easily pulled down to the logic LOW voltage (when necessary). In another embodiment, if the SRAM data storage structure is a 6T SRAM circuit, the upper supply voltage provided to the circuit during the startup operation can be reduced to provide a similar "latch weakening" effect.

In another embodiment, a memory array can include an array of SRAM cells, each including a programmable resistor connected to a storage node of the SRAM cell. During a shutdown procedure for the memory array, the data stored in the SRAM cells can be "transferred" to the programmable resistors (e.g., if a particular SRAM cell is storing a logic HIGH voltage, the programmable resistor connected to that SRAM cell can be maintained at a high resistance state, while if the SRAM cell stores a logic LOW voltage, the programmable resistor can be programmed to a low resistance state). During a startup procedure for the memory array, appropriate data values can be written back in to the SRAM cells based on the (resistance) states of the programmable resistors. Therefore, during normal operation of the memory array, the high performance benefits of the SRAM cells can be realized, while the programmable resistors allow the memory array to retain stored data even when power is removed from the memory array.

The invention will be more fully understood in view of the following description and drawings.

DETAILED DESCRIPTION

Conventional SRAM cells provide high-speed data access, but are unable to retain stored data once power is removed. Adding floating gate transistors to such SRAM cells can provide non-volatile data storage behavior, but at the cost of increasing overall cell size and fabrication process complexity. However, by incorporating programmable resistors into layers above (or below) SRAM cells (e.g., metallization layers), non-volatile storage capability can be provided without increasing cell layout size.

Figure 1A:
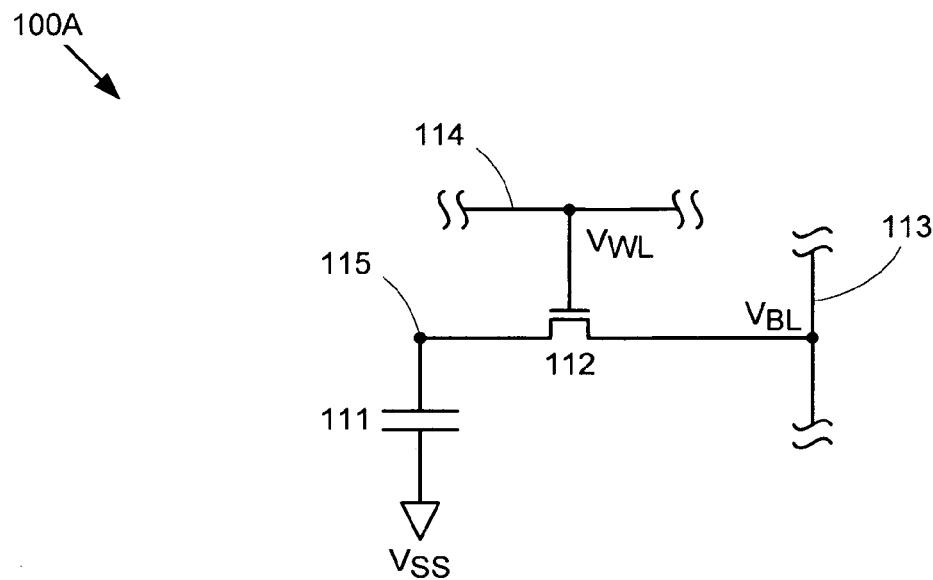
FIG. 1A is a schematic circuit diagram of a conventional DRAM cell.
Figure 1B:
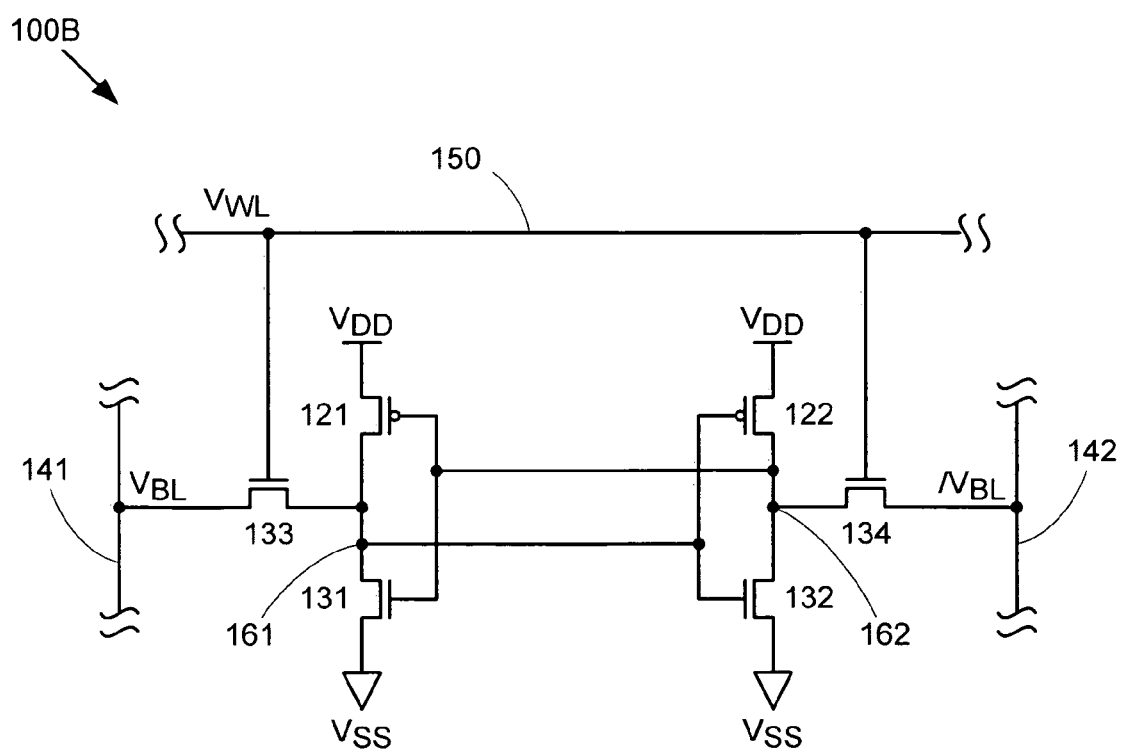
FIG. 1B is a schematic circuit diagram of a conventional SRAM cell.
Figure 2:
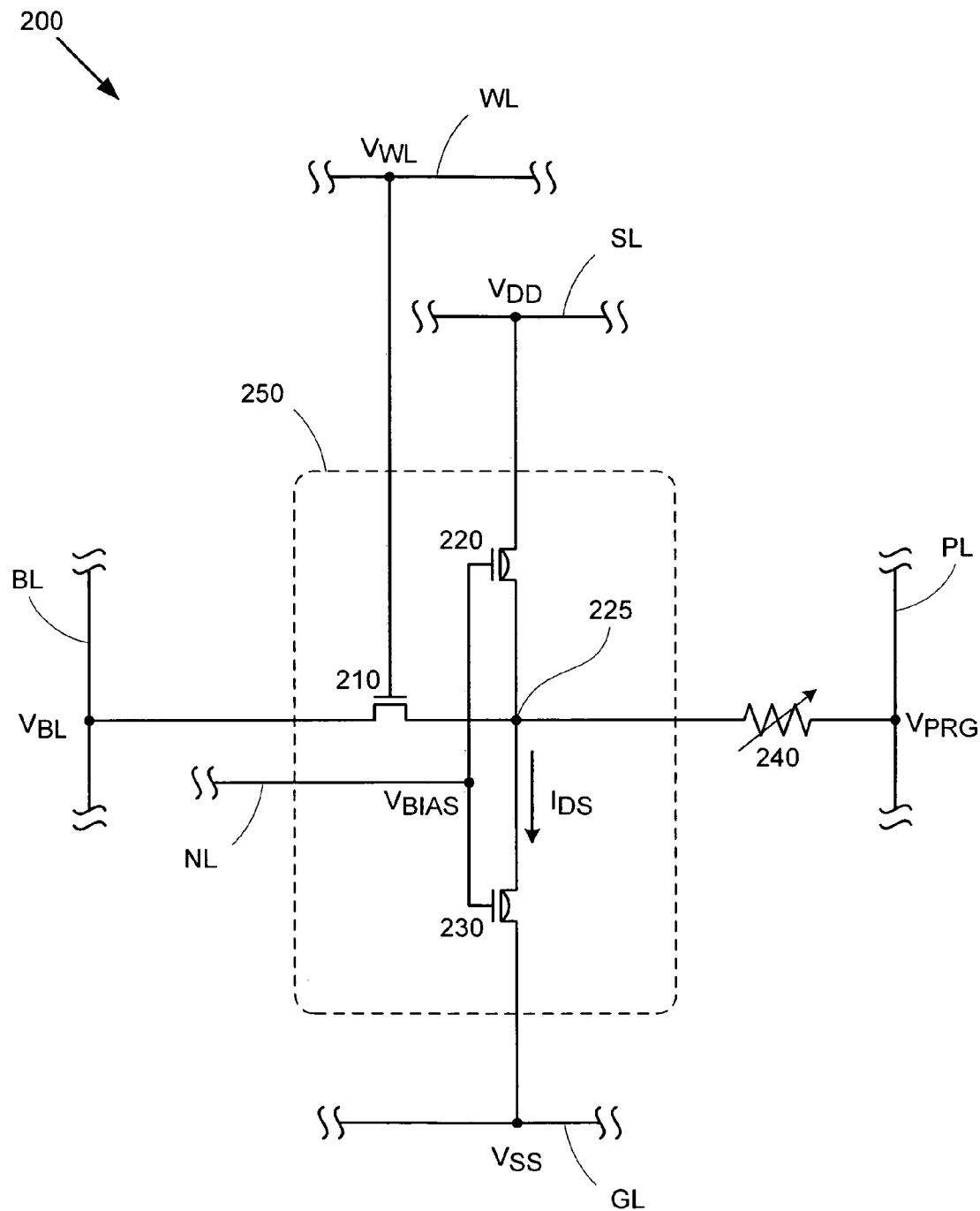
FIG. 2 is a schematic circuit diagram of a non-volatile SRAM cell.

FIG. 2 shows a schematic circuit diagram of an embodiment of a non-volatile SRAM cell 200. Non-volatile SRAM cell 200 includes an SRAM circuit 250 and a programmable resistor 240. Programmable resistor 240 is connected between a program line PL and a (data) storage node 225 in SRAM circuit 250. Note that for exemplary purposes, SRAM circuit 250 is depicted as a "3T" SRAM cell that includes n-channel transistors 210, 220, and 230. However, according to various other embodiments, SRAM circuit 250 can comprise any SRAM architecture (e.g., SRAM cell 100B shown in FIG. 1B, with storage node 225 corresponding to storage node 161).

Transistors 220 and 230 are connected in series between a voltage supply line SL and a ground supply line GL that supply an upper supply voltage $V_{DD}$ and a lower supply voltage $V_{SS}$ (e.g., ground), respectively. The junction between transistors 220 and 230 defines storage node 225. Transistor 210 is connected between storage node 225 and a bit line BL (coupled to provide/receive a bit line voltage $V_{BL}$ to/from storage node 225 via transistor 210), with the gate of transistor 210 being connected to a word line WL (which provides a word line voltage $V_{WL}$ to the gate of transistor 210). Transistor 210 serves as an access transistor for read/write operations to SRAM cell 200.

Transistors 220 and 230 are negative differential resistance (NDR) transistors, as described U.S. Pat. No. 6,512,274, issued Jan. 28, 2003 to King et al. NDR transistors 220 and 230 are fabricated using standard microfabrication techniques and can therefore be easily integrated into a standard CMOS process. For drain-to-source voltages ($V_{DS}$) lower than an NDR threshold voltage $V_{NDR}$, NDR transistors 220 and 230 behave similarly to an ordinary n-channel transistor; i.e., for a given gate bias voltage (i.e., gate-to-source voltage $V_{GS}$), the current $I_{DS}$ through the transistor increases with increasing drain-to-source voltage $V_{DS}$, until a peak value is reached. For drain-to-source voltages $V_{DS}$ greater than NDR threshold voltage $V_{NDR}$, the current $I_{DS}$ decreases exponentially with increasing drain-to-source voltage $V_{DS}$. This behavior is depicted in the graph of FIG. 3A.

Figure 3A:
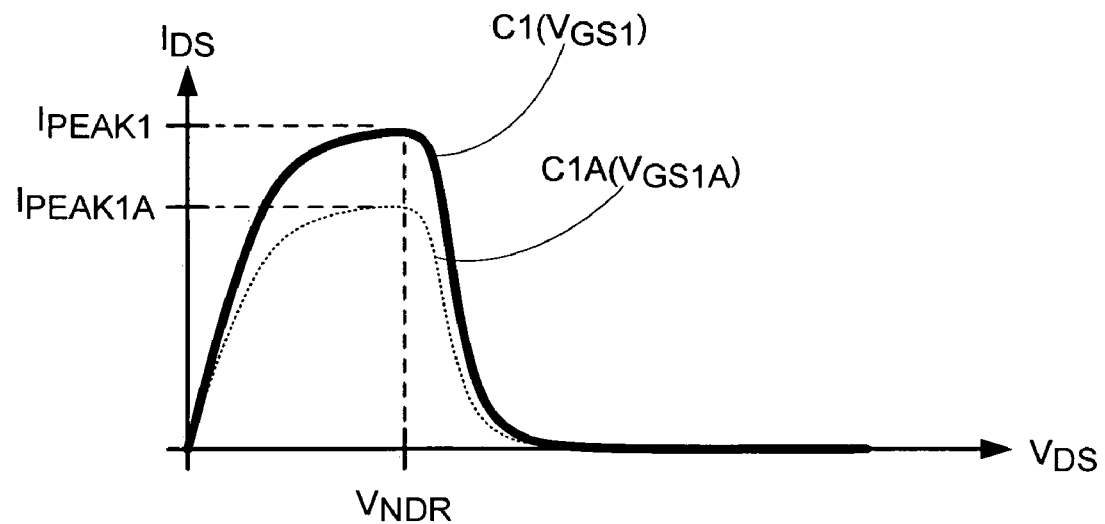
FIGS. 3A and 3B are voltage versus current graphs for NDR transistors in various configurations.

FIG. 3A shows a curve C1 of an NDR transistor that depicts current flow $I_{DS}$ through the NDR transistor as a function of drain-to-source voltage $V_{DS}$ (for a given gate bias voltage $V_{GS1}$ greater than the threshold voltage $V_{TH}$ of the transistor). Curve C1 exhibits MOS transistor behavior for drain-to-source voltages below NDR threshold voltage $V_{NDR}$, with current $I_{DS}$ increasing with increasing drain-to-source voltage $V_{DS}$. At NDR threshold voltage $V_{NDR}$, current $I_{DS}$ reaches a maximum current $I_{PEAK1}$, and any further increases in drain-to-source voltage $V_{DS}$ causes current $I_{DS}$ to rapidly decrease (NDR behavior).

Note that the value of peak current $I_{PEAK1}$ is determined by the gate bias voltage $V_{GS1}$. The larger the gate bias voltage (i.e., the larger the gate-source voltage potential), the larger the peak current for the NDR transistor. For example, a curve C1A in FIG. 3A shows the current flow $I_{DS}$ through the NDR transistor as a function of drain-to-source voltage $V_{DS}$ for a gate bias voltage $V_{GS1A}$ that is less than gate bias voltage $V_{GS1}$. As indicated by the graph, the peak current $I_{DS1A}$ for this lower gate bias voltage $V_{GS1A}$ is less than the peak current $I_{DS1}$ for gate bias voltage $V_{GS1}$.

Connecting two NDR transistors in series (such as transistors 220 and 230 in FIG. 2) allows those transistors to act as a latch circuit. To enable the latching behavior, a bias voltage $V_{BIAS}$ on an NDR control line NL is supplied to the gates of transistors 220 and 230. Bias voltage $V_{BIAS}$ is set to a level that ensures that both transistors 220 and 230 are always active (i.e., have a gate bias voltage greater than the transistor threshold voltage(s)). For example, if storage node 225 can store upper supply voltage $V_{DD}$, bias voltage $V_{BIAS}$ is preferably greater than upper supply voltage $V_{DD}$ plus the threshold voltage $V_{TH}$ of transistor 220. In any case, so long as bias voltage $V_{BIAS}$ is high enough to maintain transistors 220 and 230 in their active states, the actual behavior of transistors 220 and 230 will be determined by the voltage at storage node 225.

Figure 3B:
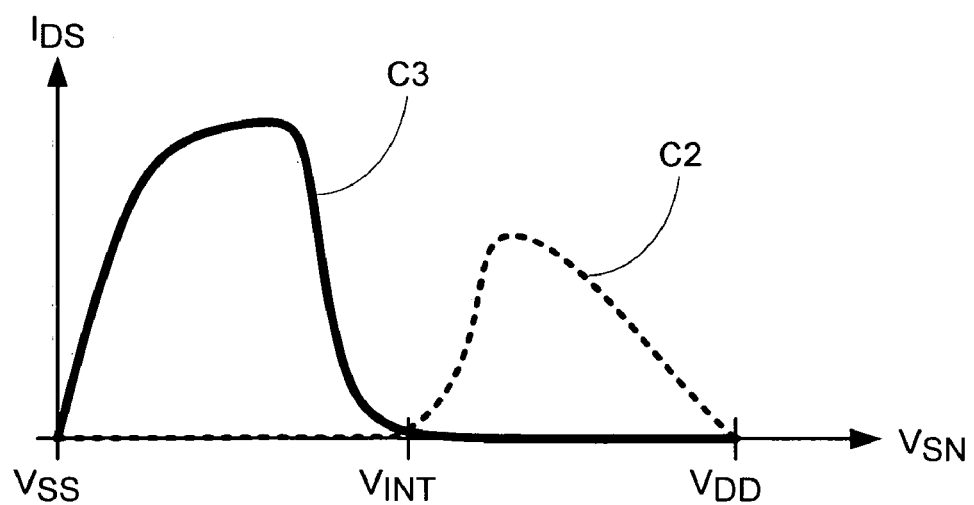

FIG. 3B shows a graph of current $I_{DS}$ versus storage node voltage $V_{SN}$ for transistor 220 (represented by curve C2) and transistor 230 (represented by curve C3). For transistor 230, curve C3 is substantially similar to curve C1 described with respect to FIG. 3A, because the drain-to-source voltage $V_{DS}$ for transistor 230 is simply the supply node voltage $V_{SN}$ and the gate bias voltage $V_{GS}$ is constant at bias voltage $V_{BIAS}$. However, for transistor 220, the drain-to-source voltage $V_{DS}$ is equal to upper supply voltage $V_{DD}$ minus the supply node voltage $V_{SN}$. Therefore, curve C2 is "reversed" relative to curve C3, because the drain-to-source voltage $V_{DS}$ of transistor 220 decreases as storage node voltage $V_{SN}$ increases. Furthermore, curve C2 is somewhat distorted relative to curve C3 because the gate biasing for transistor 220 (i.e., the gate-to-source voltage $V_{GS}$ for transistor 220) is not constant, but rather decreases as the storage node voltage $V_{SN}$ increases. Also, the threshold voltage $V_{TH}$ for transistor 220 increases with the storage node voltage $V_{SN}$.

In a steady state condition, the current $I_{DS}$ through both transistors 220 and 230 must be the same. Therefore, as indicated in FIG. 3B, three such steady state conditions exist for transistors 220 and 230. Specifically, transistors 220 and 230 conduct the same current $I_{DS}$ for storage node voltages $V_{SN}$ equal to lower supply voltage $V_{SS}$ (i.e., a logical LOW condition), upper supply voltage $V_{DD}$ (i.e., a logical HIGH condition), and an intermediate voltage $V_{INT}$ (i.e., where curves C2 and C3 intersect).

Both supply voltages $V_{SS}$ and $V_{DD}$ are stable operating points. For example, if storage node 225 is at lower supply voltage $V_{SS}$, any slight increase to storage node voltage $V_{SN}$ will cause transistor 230 to conduct significant current (as indicated by curve C3), thereby pulling storage node 225 back down to lower supply voltage $V_{SS}$ (i.e., the charge at storage node 225 causing the increase in storage node voltage $V_{SN}$ will be rapidly drained away by transistor 230). Similarly, if storage node 225 is at upper supply voltage $V_{DD}$, any decrease in storage node voltage $V_{SN}$ will cause transistor 220 to conduct significant current (as indicated by curve C2), thereby pulling storage node 225 back up to upper supply voltage $V_{DD}$ (i.e., any charge lost from storage node 225 causing the decrease in storage node voltage $V_{SN}$ will be rapidly replenished by transistor 220).

However, intermediate voltage $V_{INT}$ is not a stable operating point. Any perturbation away from intermediate voltage $V_{INT}$ will tend to pull storage node voltage $V_{SN}$ to one of supply voltages $V_{SS}$ or $V_{DD}$. For example, if storage node voltage $V_{SN}$ decreases slightly from intermediate voltage $V_{INT}$, transistor 230 will conduct significant current (indicated by curve C3) to pull storage node 225 down to lower supply voltage $V_{SS}$. Similarly, if storage node voltage $V_{SN}$ increases slightly from intermediate voltage $V_{INT}$, transistor 220 will conduct significant current (indicated by curve C2) to pull storage node 225 up to upper supply voltage $V_{DD}$. Note that intermediate voltage $V_{INT}$ will ideally be equal to half of the difference between upper supply voltage $V_{DD}$ and lower supply voltage $V_{SS}$ to allow transistors 220 and 230 to provide rapid latching. Note further that the larger the bias voltage VBIAS provided to the gates of transistors 220 and 230, the larger the peak currents that will be exhibited by transistors 220 and 230, and hence, the stronger the latching effect that can be achieved.

In this manner, transistors 220 and 230 provide data storage capabilities for SRAM circuit 250 (and hence for SRAM cell 200). Transistor 210 is a standard MOS transistor that provides read/write access to storage node 225 at the junction of transistors 220 and 230. To write a data value into SRAM cell 200, bit line BL is set to the desired data value and word line WL is set to a logic HIGH level, thereby turning on transistor 210. The data level on bit line BL is then latched into SRAM circuit 250 by transistors 220 and 230, and word line WL is set to a logic LOW level to turn off transistor 210 and complete the write operation. To read data from SRAM cell 200, word line WL is set to a logic HIGH level to turn on transistor 210, and the voltage at storage node 225 is read out onto bit line BL, after which word line WL is set to a logic LOW level to turn off transistor 210 and complete the read operation.

Note that while transistor 210 is depicted as an n-channel transistor for exemplary purposes, transistor 210 could be replaced with any other type of access device or circuit. For example, in another embodiment, transistor 210 could be implemented as a p-channel transistor. Read/write operations to SRAM cell 200 could then be performed in substantially the same manner as described above, except with word line WL being set to a logic LOW level to turn on the p-channel transistor and allow access to storage node 225.

Programmable resistor 240 is a resistance-change memory (RCM) element that can be fabricated outside of the plane of the transistors (typically in a metallization layer above the transistors, although any other location (e.g., below or to the side) is possible), thereby minimizing the layout impact of adding the RCM element to SRAM circuit 250. In one embodiment, programmable resistor 240 can comprise a structure substantially similar to the Programmable Metallization Cell (PMC) developed by Axon Technologies Corporation. The PMC is a multilayer stack formed in a via in a dielectric layer. By applying a relatively low forward voltage (e.g., <1.0 V) and bias current (e.g., <1.0 µA) to a PMC, the PMC can be programmed to a low resistance state (e.g., <$10^5$ ohms). A reverse voltage (e.g., <1.0 V) and bias current (e.g., <1.0 µA) could subsequently be used to reprogram the PMC back to a high resistance state (e.g., >$10^9$ ohms). Programming speed for a PMC is relatively fast (on the order of a few nanoseconds).

Programmable resistor 240 is configured such that it can be programmed to a high resistance state by applying a positive voltage potential (greater than a minimum "limit voltage") and current flow between storage node 225 and program line PL (i.e., storage node 225 having a voltage greater than a voltage $V_{PRG}$ on program line PL). Programmable resistor 240 is further configured such that it can be programmed to a low resistance state by applying a negative voltage potential (with an absolute value greater than another "limit voltage" that can be the same or different than the limit voltage for programming to the high resistance state) and current flow between storage node 225 and program line PL (i.e., storage node 225 having a voltage less than the voltage $V_{PRG}$ on program line PL).

During normal operation of SRAM cell 200 (i.e., periods when SRAM cell 200 is powered on and not undergoing startup or shutdown operations), programmable resistor 240 is maintained in a high resistance state by holding program line PL at a logic LOW state. The logic LOW voltage on program line PL ensures that regardless of the stored voltage at storage node 225, a negative voltage potential will never be imposed across programmable resistor 240 (between storage node 225 and program line PL). For example, if a logic HIGH is stored at storage node 225, a positive voltage potential will exist across programmable resistor 240, thereby maintaining the high resistance state of programmable resistor 240. If a logic LOW value is stored at storage node 225, a zero voltage potential will exist across programmable resistor 240, which results in no change to the state of programmable resistor 240.

Thus, during normal operation, programmable resistor 240 remains in a high resistance state regardless of the behavior of SRAM circuit 250, so long as program line PL is held at a logic LOW state. Because of the high resistance exhibited by programmable resistor 240 in this state, minimal current can flow through programmable resistor 240 even when data storage node 225 is storing a logic HIGH voltage. However, as described in greater detail below, programmable resistor 240 allows SRAM cell 200 to retain the data stored at storage node 225 even when power is removed from SRAM cell 200 (i.e., when supply voltages $V_{DD}$ and $V_{SS}$ are no longer supplied to supply lines SL and GL, respectively).

Specifically, during the shutdown procedure for SRAM cell 200, word line WL is held at a logic LOW state to ensure that SRAM circuit 250 is isolated from any activity on bit line BL, and program line PL is raised to a logic HIGH level. If storage node 225 is storing a logic HIGH value, then there is a zero voltage potential across programmable resistor 240 and programmable resistor 240 remains in a high resistance state. However, if storage node 225 is at a logic LOW, then a negative voltage potential will exist across programmable resistor 240 (from storage node 225 to program line PL), thereby causing programmable resistor 240 to be programmed to a low resistance state (so long as the difference between logic HIGH and logic LOW voltages is greater than the limit voltage required for programming of programmable resistor 240). Therefore, once the shutdown procedure is complete, programmable resistor 240 retains a non-volatile indication of the data last stored in SRAM circuit 250 (i.e., high resistance state representing a logic HIGH value and a low resistance state representing a logic LOW value).

When power is restored to SRAM cell 200, the state of programmable resistor 240 can be used to initialize SRAM circuit 250 with the same data value present when power was last present. Specifically, during a startup process for SRAM cell 200, a logic HIGH value is initially stored at data storage node 225 (i.e., bit line BL is charged to a logic HIGH level, word line WL is set to a logic HIGH state to turn on transistor 210 and allow the logic HIGH state on bit line BL to be latched into the latch formed by NDR transistors 220 and 230, and word line WL is then set to a logic LOW state to turn off transistor 210 and complete the storage operation). Program line PL is then set to a logic LOW level, at which point the state of programmable resistor 240 determines the voltage to be stored at storage node 225.

If programmable resistor 240 is in a high resistance state, minimal current will flow through programmable resistor 240 and storage node 225 will remain at a logic HIGH level (any charge lost through programmable resistor 240 will quickly be replenished by the NDR action of transistors 220 and 230, as described above with respect to FIGS. 3A and 3B). However, if programmable resistor 240 is in a low resistance state, a large current will flow from storage node 225 to program line PL. This current is large enough to overcome the latching effect of transistors 220 and 230, thereby pulling storage node 225 down to a logic LOW state. At the same time, the positive voltage potential across programmable resistor 240 (between storage node 225 and program line PL) and the resulting current flow reprograms programmable resistor 240 to a high resistance state. Thus, once the startup procedure for SRAM cell 200 is completed, the data value previously present at storage node 225 prior to shutdown is restored at storage node 225, and programmable resistor 240 is returned to (or maintained at) a high resistance state.

Note that in one embodiment, this startup process for SRAM cell 200 can be enhanced by "weakening" the latching effect provided by transistors 220 and 230. Specifically, by reducing bias voltage VBIAS provided along NDR control line NL to the gates of NDR transistors 220 and 230, the peak currents for transistors 220 and 230 can be reduced (as described with respect to FIG. 3A). As a result of this reduced peak current, the current flow between storage node 225 and program line PL required to pull storage node down to a logic LOW level during the startup process can be reduced, thereby allowing faster and more robust state restoration upon power-up of SRAM cell 200. In one embodiment, bias voltage VBIAS can be turned off completely (i.e., set equal to lower supply voltage $V_{SS}$) to turn of the latching effect of transistors 220 and 230 (by turning off those transistors). Once the startup process is complete, bias voltage $V_{BIAS}$ can be restored back to a high level (i.e., greater than upper supply voltage $V_{SS}$ plus the threshold voltage of transistor 220) to ensure proper function of SRAM circuit 250.

According to various other embodiments, if SRAM circuit 250 is implemented using a circuit other than the exemplary 3T arrangement, other techniques may be available to provide the latch weakening described above. For example, if SRAM circuit 250 is a 6T SRAM cell (e.g., as described with respect to FIG. 1B), upper supply voltage $V_{DD}$ could be reduced to cause the at least some of the inverter transistors in the 6T SRAM cells (e.g., transistors 121, 122, 131, and 132) to operate in the linear region, thereby reducing the strength of the inverters formed by those transistors and allowing the low program voltage $V_{PRG}$ to more easily pull down the stored logic HIGH voltage through a low resistance programmable transistor 240. Various other "weakening" techniques for use during the startup process will be readily apparent.

In this manner, SRAM cell 200 combines the high performance read/write aspects of SRAM technology with non-volatile data storage capabilities. Because programmable resistor 240 can be formed in a via above SRAM circuit 250, the overall size of SRAM cell 200 is substantially the same as SRAM circuit 250. Thus, the 3T structure shown for SRAM circuit 250 would define the overall size of SRAM cell 200. Similarly, if SRAM circuit 250 included a 6T SRAM structure (e.g., as described with respect to FIG. 1B), SRAM cell 200 would occupy the area of a 6T SRAM cell.

Figure 4:
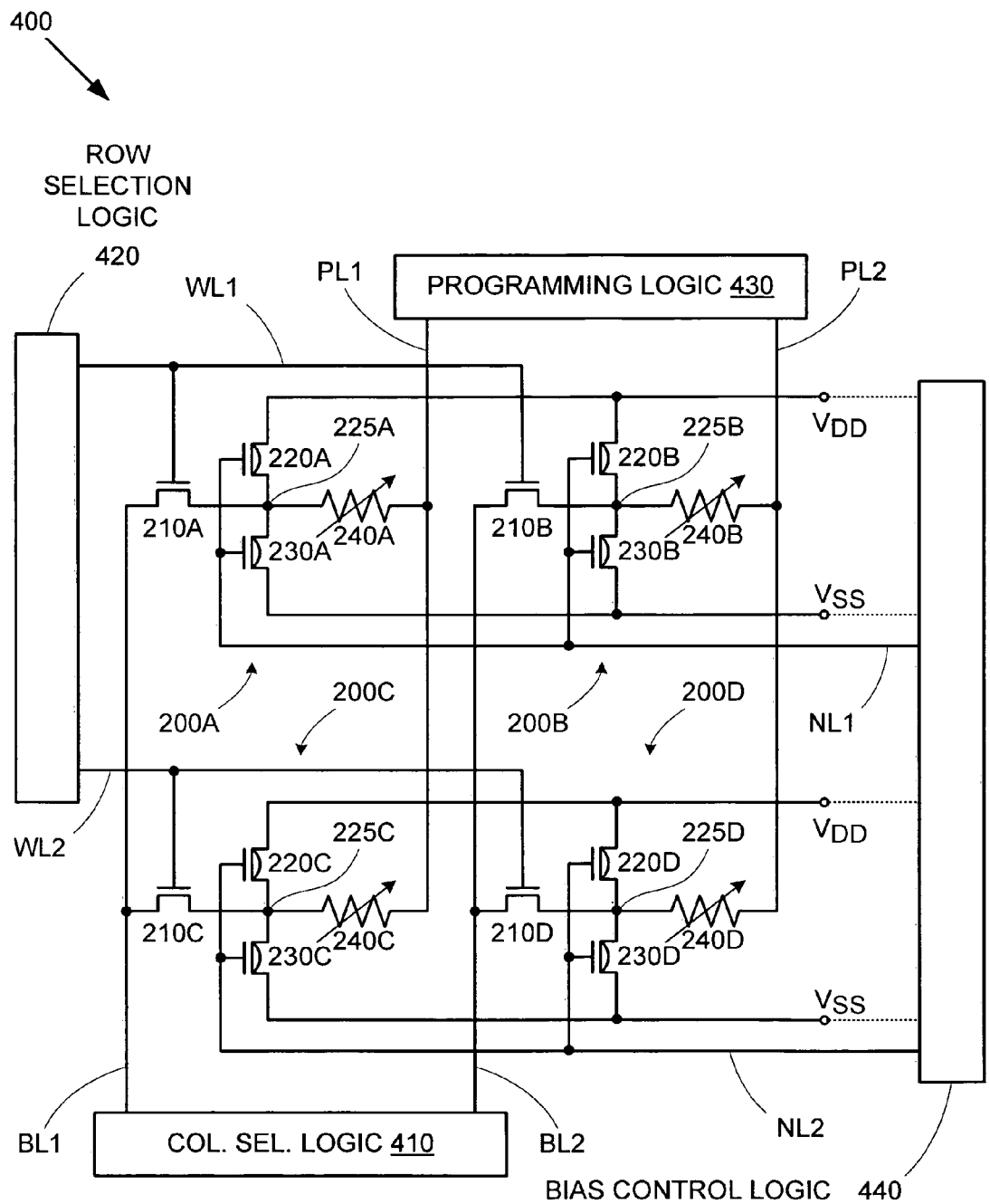
FIG. 4 is a schematic circuit diagram of a memory array incorporating non-volatile SRAM cells.

FIG. 4 shows a schematic circuit diagram of an embodiment of a memory array 400 providing SRAM performance and non-volatile data storage. Memory array 400 is a 2×2 memory array that includes memory cells 200A, 200B, 200C, and 200D, column selection logic circuitry 410, row selection logic circuitry 420, programming logic circuitry 430, and bias control logic circuitry 440. Each of memory cells 200A-200D is substantially similar to memory cell 200 described with respect to FIG. 2. Note that while each of memory cells 200 (i.e., memory cells 200A-200D) in FIG. 4 is depicted and described as having a 3T, NDR transistor-based structure for exemplary purposes, in various other embodiments memory cells 200 could be implemented using any type of SRAM structure (e.g., a 6T SRAM structure, as described with respect to FIG. 1B, in which case bias control logic circuitry 440 may not be required). Note further that while memory array 400 is depicted and described as having a 2×2 array of memory cells 200 for exemplary purposes, in various other embodiments, memory array 400 can include any number and arrangement of memory cells 200, and can also include conventional SRAM cells (e.g., SRAM cell 100B shown in FIG. 1B) in addition to non-volatile SRAM memory cells 200.

Column selection logic circuitry 410 drives bit lines BL1 and BL2, and row selection logic circuitry 420 drives word lines WL1 and WL2. Transistors 210A and 210C are connected between bit line BL1 and storage nodes 225A and 225C, respectively, of memory cells 200A and 200C, respectively. Transistors 210B and 210D are connected between bit line BL2 and storage nodes 225B and 225D, respectively, of memory cells 200B and 200D, respectively. Word line WL1 is connected to the gates of transistors 210A and 210B, and word line WL2 is connected to the gates of transistors 210C and 210D.

Thus, during normal operation of memory array 400, to write a data value into one row of memory cells 200A-200D, column selection logic circuitry 410 drives the bit lines BL1 and BL2 to the desired data values, and row selection logic circuitry 420 temporarily drives the appropriate one of word lines WL1 and WL2 to a logic HIGH level to turn on two of transistors 210A-210D to allow the data values to be latched into the desired row of memory cells 200A-200D. Similarly, to read data values from one row of memory cells 200A-200D, row selection logic circuitry 420 temporarily drives the appropriate one of word lines WL1 and WL2 to a logic HIGH level to turn on transistors 210A and 210B or transistors 210C and 210D, respectively, and the data values from the desired ones of storage nodes 225A-225D are read out along one of bit lines BL1 and BL2.

Programming logic circuitry 430 drives program lines PL1 and PL2, and bias control logic circuitry 440 drives NDR control lines NL1 and NL2. Programmable resistors 240A and 240C are connected between program line PL1 and storage nodes 225A and 225C, respectively, of memory cells 200A and 200C, respectively. Programmable resistors 240B and 240D are connected between program line PL2 and storage nodes 225B and 225D, respectively, of memory cells 200B and 200D, respectively. NDR control line NL1 is connected to the gates of NDR transistors 220A and 230A in memory cell 200A, and is connected to the gates of NDR transistors 220B and 230B in memory cell 200B. NDR control line NL2 is connected to the gates of NDR transistors 220C and 230C in memory cell 200C, and is connected to the gates of NDR transistors 220D and 230D in memory cell 200D.

As described with respect to FIG. 2, during normal operation of memory array 400, bias control logic circuitry 440 holds NDR control lines NL1 and NL2 at a level that ensures that NDR transistors 220 and 230 in each memory cell 200 are biased into their active states, regardless of the state of storage node 225 (e.g., by setting NDR control lines NL1 and NL2 to upper supply voltage $V_{DD}$ plus the threshold voltage of NDR transistor 220). Meanwhile, programming logic circuitry 430 holds program lines PL1 and PL2 at a level that ensures that the voltage potential from the storage node 225 in each memory cell 200 to its respective program line PL is never negative, thereby ensuring that programmable resistors 240A-240D remain in their high resistance states.

However, during the shutdown procedure just before power is removed from memory array 400, row selection logic circuitry 420 holds word lines WL1 and WL2 at a logic LOW level to turn transistors 210A-210D off, and programming logic circuitry 430 raises program lines PL1 and PL2 to a logic HIGH state. As described above with respect to FIG. 2, if any of storage nodes 225A-225B is storing a logic LOW value, the logic HIGH program line PL1 or PL2 will program the associated programmable resistor 240A-240D, respectively, to a low resistance state. Thus, once power is removed from memory array 400, a record of the last stored data in memory cells 200A-200D is provided by programmable resistors 240A-240D, respectively.

When powering memory array 400 back on, as described above with respect to FIG. 2, logic HIGH values are initially stored in each memory cell 200A-200D, after which the states of programmable resistors 240A-240D set the initial values stored at storage nodes 225A-225D, respectively. Specifically, once a logic HIGH value is stored at each of storage nodes 225A-225D, programming logic circuitry 430 sets program lines PL1 and PL2 to a logic LOW state. The data value in any memory cell 200A-200D that includes a programmable resistor 240A-240D, respectively, in a high resistance state remains at a logic HIGH state, because the high resistance prevents any significant current flow (i.e., charge removal). However, any of programmable resistors 240A-240D is in a low resistance state will conduct significant current, thereby pulling down the associated one(s) of storage nodes 225A-225D, respectively, to a logic LOW level(s), and also programming the programmable resistor(s) back to a high resistance state.

Note that in one embodiment, during this startup process, bias control logic circuitry 440 can reduce (or turn off completely) the voltage on NDR control lines NL1 and NL2 to enhance this pulldown/program operation (i.e., by weakening the latching effect of NDR transistors 220 and 230 in each of memory cells 200). In another embodiment, if each memory cell 200 includes a 6T SRAM structure (e.g., as described with respect to FIG. 1B) in place of the NDR transistor-based 3T structure depicted, bias control logic circuitry 440 can reduce the upper supply voltage $V_{DD}$ (as indicated by the dotted lines) to weaken the latching strength of the 6T SRAM structure to enhance the pulldown/program operation during the startup process.

The various embodiments of the structures and methods of this invention that are described above are illustrative only of the principles of this invention and are not intended to limit the scope of the invention to the particular embodiments described. Thus, the invention is limited only by the following claims and their equivalents.

The invention claimed is:

1. A memory cell comprising:
    a static random access memory (SRAM) circuit comprising a storage node, wherein the SRAM circuit comprises:
        a first negative differrential resistance (NDR) transistor connected between an upper supply voltage line and the storage node;
        a second NDR transistor connected between the storage node and a lower supply voltage line; and
        an access transistor connected between a bit line and the storage node, the access transistor having a gate connected to a word line; and
    a programmable resistor, the programmable resistor comprising:
        a first terminal connected to the storage node; and
        a second terminal coupled to receive a programming voltage,
        the programmable resistor being configured to be programmed to a first resistance state when a storage voltage at the storage node is greater than the programming voltage, and
        the programmable resistor being configured to be programmed to a second resistance state when the storage voltage at the storage node is less than the programming voltage.

2. The memory cell of claim 1, wherein the first resistance state is a high resistance state, and wherein the second resistance state is a low resistance state.

3. The memory cell of claim 1, wherein a gate of the first NDR transistor and a gate of the second NDR transistor are coupled to receive a bias voltage,
    wherein the bias voltage is adjustable to a first voltage during normal operation of the memory cell and to a second voltage during a startup operation for the memory cell, the second voltage being less than the first voltage.

4. The memory cell of claim 3, wherein the first voltage is equal to at least an upper supply voltage plus a threshold voltage of the first NDR transistor.

5. The memory cell of claim 1, wherein the SRAM circuit comprises a 6-transistor (6T) SRAM cell.

6. A memory cell comprising:
    a static random access memory (SRAM) circuit comprising a storage node, wherein the SRAM circuit comprises a set of transistors; and
    a programmable resistor, the programmable resistor comprising:
        a first terminal connected to the storage node; and
        a second terminal coupled to receive a programming voltage,
        wherein the programmable resistor is configured to be programmed to a first resistance state when a storage voltage at the storage node is greater than the programming voltage,
        wherein the programmable resistor is configured to be programmed to a second resistance state when the storage voltage at the storage node is less than the programming voltage, and
        wherein the programmable resistor is formed in a metallization layer above the set of transistors.

7. A method for operating a static random access memory (SRAM) array, the method comprising:
    performing a shutdown procedure before removing power from the SRAM array, the SRAM array comprising a plurality of memory cells, each of the plurality of memory cells comprising an SRAM circuit and a programmable resistor connected to a storage node in the SRAM circuit, wherein the SRAM circuit comprises a first negative differential resistance (NDR) transistor connected between an upper supply voltage and the storage node, and a second NDR transistor connected between the storage node and a lower supply voltage,
    wherein performing the shutdown procedure comprises:
    changing a resistance of the programmable resistor from a first resistance state to a second resistance state for each of the plurality of memory cells in which the SRAM circuit is storing a first data value at the storage node; and maintaining the resistance of the programmable resistor at the first resistance state for each of the plurality of memory cells in which the SRAM circuit is storing a second data value at the storage node, wherein storing the second data value comprises supplying a lowered gate bias voltage to a gate of the first NDR transistor and to a gate of the second NDR transistor, the lowered gate bias voltage being less than the upper supply voltage plus a threshold voltage of the first NDR transistor.

8. The method of claim 7, further comprising performing a startup operation after supplying power to the SRAM array, wherein performing the startup operation comprises:
   storing the second data value at the storage node of the SRAM structure in each of the plurality of memory cells in which the programmable resistor is at the first resistance state;
   storing the first data value at the storage node of the SRAM circuit in each of the plurality of memory cells in which the programmable resistor is at the second resistance state; and
   setting the programmable resistor in each of the plurality of memory cells to the first resistance state.

9. The method of claim 8, wherein the programmable resistor in each of the plurality of memory cells comprises a first terminal connected to the storage node and a second terminal connected to one of a set of program lines,
   wherein each programmable resistor is configured to be programmed to the second resistance state when a first voltage at the first terminal is less than a second voltage at the second terminal by at least a first limit voltage,
   wherein the first data value comprises a logic LOW voltage,
   wherein the second data value comprises a logic HIGH voltage, and
   wherein changing the resistance of the programmable resistor from the first resistance state to the second resistance state comprises setting the program line equal to the logic HIGH voltage, the logic HIGH voltage being greater than the logic LOW voltage by at least the first limit voltage.

10. The method of claim 9, wherein each programmable resistor is further configured to be programmed to the first resistance state when the first voltage at the first terminal is greater than the second voltage at the second terminal by a second limit voltage,
   wherein the first resistance state is a high resistance state,
   wherein the second resistance state is a low resistance state, and
   wherein storing the first data value, storing the second data value, and setting the programmable resistor in each of the plurality of memory cells to the first resistance state comprises:
      writing the second data value to the storage node of the SRAM circuit in each of the plurality of memory cells; and
      setting each of the set of program lines to the logic LOW voltage,
      wherein the logic HIGH voltage is greater than the logic LOW voltage by at least the second limit voltage, and
      wherein when the programmable resistor in one of the plurality of memory cells is in the second resistance state and the logic HIGH voltage is stored at the storage node of the one of the plurality of memory cells, the storage node will be discharged to the logic LOW voltage through the programmable resistor when the logic LOW voltage is supplied to the second terminal of the programmable resistor.

11. The method of claim 7, wherein the lowered gate bias voltage is equal to the lower supply voltage.

12. A memory array comprising:
   program logic circuitry for generating a first program voltage during a shutdown procedure for the memory array;
   a plurality of memory cells, each of the plurality of memory cells comprising a data storage node and a programmable resistor coupled between the data storage node and the program logic circuitry,
   wherein the first program voltage causes the programmable resistor to be maintained in a high resistance state in each of the plurality of memory cells that is storing a logic HIGH voltage at the data storage node, and
   wherein the first program voltage causes the programmable resistor to be programmed to a low resistance state in each of the plurality of memory cells that is storing a logic LOW voltage at the data storage node;
   a plurality of upper supply lines for receiving an upper supply voltage;
   a plurality of lower supply lines for receiving a lower supply voltage;
   a plurality of bit lines; and
   a plurality of word lines,
   wherein each of the plurality of memory cells comprises:
      a first negative differential resistance (NDR) transistor connected between one of the plurality of upper supply lines and the data storage node;
      a second NDR transistor connected between the data storage node and one of the plurality of lower supply lines; and
      a metal-oxide-semiconductor (MOS) transistor connected between one of the plurality of bit lines and the data storage node,
      wherein a gate of the MOS transistor is connected to one of the plurality of word lines.

13. The memory array of claim 12, further comprising row selection logic circuitry and column selection logic circuitry for writing the logic HIGH voltage to the data storage node in each of the plurality of memory cells during a startup procedure for the memory array,
   wherein the program logic circuitry further generates a second program voltage during the startup procedure,
   wherein the second program voltage causes the logic HIGH voltage at the data storage node to be pulled down to the logic LOW voltage in each of the plurality of memory cells in which the programmable resistor is in the low resistance state, and
   wherein the second program voltage causes the programmable resistor to be programmed to the high resistance state in each of the plurality of memory cells in which the programmable resistor is in the low resistance state.

14. The memory array of claim 12, wherein the first program voltage and the logic HIGH voltage are equal to the upper supply voltage, and
   wherein the second program voltage and the logic LOW voltage are equal to the lower supply voltage.

15. The memory array of claim 14, further comprising a plurality of bias control lines for supplying a bias voltage to a gate of the first NDR transistor and a gate of the second NDR transistor in each of the plurality of memory cells,
   wherein during the startup procedure, the bias voltage is less than the upper supply voltage plus a threshold voltage of the first NDR transistor, and and wherein after the startup procedure, the bias voltage is increased to at least the upper supply voltage plus the threshold voltage of the first NDR transistor.

16. The memory array of claim 12, further comprising startup control logic circuitry for reducing the upper supply voltage during the startup procedure.

17. A memory array comprising:
a plurality of static random access memory (SRAM) cells, each of the plurality of SRAM cells comprising a data storage node, a programmable resistor coupled to the data storage node, a first negative differential resistance (NDR) transistor connected between the data storage node and an upper supply line for receiving an upper supply voltage, and a second NDR transistor connected between the data storage node and a lower supply line for receiving a lower supply voltage; and
shutdown means for programming the programmable resistor from a first resistance state to a second resistance state in only the SRAM cells that are storing a first data value at the data storage node during a shutdown procedure for the memory array.

18. The memory array of claim 17, further comprising startup means for writing a second data value to the data storage node in each of the plurality of SRAM cells in which the programmable resistor is in the first resistance state during a startup procedure for the memory array, and for writing the first data value to the data storage node in each of the plurality of SRAM cells in which the programmable resistor is in the second resistance state during the startup procedure.

19. The memory array of claim 18, wherein the first resistance state is a high resistance state,
wherein the second resistance state is a low resistance state,
wherein the first data value is a logic LOW voltage, and
wherein the second data value is a logic HIGH voltage.

20. The memory array of claim 19, wherein the shutdown means comprises:
a plurality of program lines, wherein the programmable resistor in each of the plurality of SRAM cells is connected to one of the plurality of program lines; and
a shutdown circuit for supplying a logic HIGH voltage to the plurality of program lines during the shutdown procedure,
wherein all programmable resistors connected storage nodes storing the logic LOW voltage are programmed to the low resistance state in response to the logic HIGH voltage on the plurality of program lines, and
wherein all programmable resistors connected to storage nodes storing the logic HIGH voltage are maintained at the high resistance state in response to the logic HIGH voltage on the plurality of program lines.

21. The memory array of claim 20, wherein the startup means comprises:
the plurality of program lines; and
a startup circuit for, during the startup procedure, writing the logic HIGH voltage to the data storage node in each of the plurality of SRAM cells and supplying a logic LOW voltage to the plurality of program lines,
wherein the data storage nodes connected to programmable resistors in the high resistance state are maintained at the logic HIGH voltage in response to the logic LOW voltage on the plurality of program lines, and
wherein the data storage nodes connected to programmable resistors in the low resistance state are pulled to the logic LOW voltage in response to the logic LOW voltage on the plurality of program lines, and
wherein each of the programmable resistors in the low resistance state is programmed to the high resistance state in response to the logic LOW voltage on the plurality of program lines.

22. The memory array of claim 21,
wherein the startup means further comprises:
a plurality of bias lines connected to a gate of the first NDR transistor and a gate of the second NDR transistor in each of the plurality of SRAM cells; and
biasing means for supplying a first bias voltage to the plurality of bias lines during the startup procedure and for supplying a second bias voltage to the plurality of bias lines after the startup procedure,
wherein the first bias voltage is less than the upper supply voltage plus a threshold voltage of the first NDR transistor, and
wherein the second bias voltage is at least equal to the upper supply voltage plus the threshold voltage of the first NDR transistor.

23. The memory array of claim 22, wherein the programmable resistor in each of the plurality of SRAM cells is formed in a layer above the first NDR transistor and the second NDR transistor.

* * * * *